United States Patent [19]

Ogura et al.

[11] Patent Number: 5,815,038
[45] Date of Patent: Sep. 29, 1998

[54] DISTORTION COMPENSATION CIRCUIT

[75] Inventors: Satoshi Ogura; Kiyoharu Seino; Tomohiko Ono; Akihiro Kamikokura; Haruzo Hirose, all of Tokyo, Japan

[73] Assignee: Mitsubishi Denki Kabushiki Kaisha, Tokyo, Japan

[21] Appl. No.: 635,710

[22] Filed: Apr. 22, 1996

[30] Foreign Application Priority Data

Apr. 28, 1995 [JP] Japan .................................. 7-105923
Oct. 2, 1995 [JP] Japan .................................. 7-255071

[51] Int. Cl.⁶ ...................................................... H03F 1/26
[52] U.S. Cl. ........................... 330/149; 330/277; 330/296
[58] Field of Search .................................. 330/149, 277, 330/296, 289, 295

[56] References Cited

U.S. PATENT DOCUMENTS

| 4,011,518 | 3/1977 | Irvine et al. | 330/277 X |
|---|---|---|---|
| 4,392,252 | 7/1983 | Cluniat | 455/116 |
| 4,532,477 | 7/1985 | Green, Jr. et al. | 330/149 |
| 4,564,816 | 1/1986 | Kumar et al. | 330/149 |
| 4,682,119 | 7/1987 | Michel | 330/149 |
| 5,138,275 | 8/1992 | Abbiati et al. | 330/149 |
| 5,162,748 | 11/1992 | Katz | 330/149 |
| 5,363,058 | 11/1994 | Sasaki | 330/277 X |

FOREIGN PATENT DOCUMENTS

| 0040127 | 11/1981 | European Pat. Off. |
| 0190073 | 8/1986 | European Pat. Off. |
| 0 451 909 A2 | 10/1991 | European Pat. Off. |
| 0451909 | 10/1991 | European Pat. Off. |
| 35 26 748 A1 | 1/1987 | Germany |
| 53-085142 | 7/1978 | Japan |
| 4-292005 A | 10/1992 | Japan |
| 5-235646 A | 9/1993 | Japan |
| 6-69731 A | 3/1994 | Japan |
| 7-7333 A | 1/1995 | Japan |
| 2020500 | 11/1979 | United Kingdom |

OTHER PUBLICATIONS

Masatoshi Nakayama, et al "A Novel Amplitude and Phase Linearizing Technique for Microwave Power Amplifiers" 1995 IEEE Mitsubishi Electric Corporation.

Rodrigo Cordeiro Tupynamba & Edmar Camargo "Mesfet Nonlinearities Applied to Predistortion Linearization Design" 1992 IEEE MTT-S Digest.

Satoshi Ogura, Kiyoharu Seino, Toshihiko Ozawa, Akihiro Kamikokura, Tadashi Takagi and Haruzo Hirose "A Linearized C–band Solid State Power Amp[lifier for Satellite Use" Mitsubishi Electric Corp. pp. 567–570.

*Primary Examiner*—Steven Mottola
*Attorney, Agent, or Firm*—Wolf, Greenfield & Sacks, P.C.

[57] ABSTRACT

A small-sized distortion compensation circuit is disclosed. In a semi-conductor element having three terminals, its gate is used as an input terminal. One of the drain and source is used as an output terminal, and the other is grounded. This structure does not need a conventionally used circuit comprising a complicated combination of distributors, couplers and attenuators, enabling the circuit to be smaller.

18 Claims, 20 Drawing Sheets

Vds = VOLTAGE BETWEEN DRAIN AND SOURCE
Id = DRAIN CURRENT
Vgs = VOLTAGE BETWEEN GATE AND SOURCE

DISTORTION COMPENSATION CIRCUIT

BACKGROUND OF THE INVENTION

1. Field of the invention

The present invention relates to a distortion compensation circuit for compensating non-linear distortion generated in output signals of high frequency amplifiers.

2. Description of the related arts

The non-linearity of semi-conductors used in a high power high frequency amplifier brings about distorted waves in output signals of the amplifier. Many distortion compensation circuits (called "linearizer(s)" hereafter) are used for compensating the non-linear distortion. The linearizers are classified into two types. One is a pre-distortion type, disposed before an amplifier whose distorted output signals are to be compensated. Output signals of the pre-distortion type linearizer are inputted to the amplifier. The other is a feed forward type, combining distorted output signals of the amplifier and those of the feed forward type linearizer in order to compensate the distortion. The former pre-distortion type is often used due to its good power efficiency.

An equivalent circuit of a current pre-distortion type linearizer disclosed at 1994 Asia Pacific Microwave Conference (pp 567–570) is shown in FIG. 12. In this linearizer, a distortion generating amplifier 48, a first attenuator 50 and a first equi-power distributor 62 are successively connected to one of the output terminals 56 of a first coupler 52. A second attenuator 51, a linear amplifier 49 and a second equi-power distributor 63 are successively connected to the other output terminal 57 of the first coupler 52. The output terminal of the first equi-power distributor 62 and one of the output terminals of the second equi-power distributor 63 are connected to the input terminals 58 and 59 of a second coupler 53, respectively. The output terminal of the second coupler 53 is connected to an input terminal 60 of a fourth coupler 55 via a first variable attenuator 64. The other output terminal of the second equi-power distributor 63 is connected to the other input terminal 61 of the fourth coupler 55 via a second variable attenuator 65 and a third coupler 54. This linearizer is formed on a dielectric substrate by means of microwave integrated circuit technology. Field-effect transistors (FETS) are used in the distortion generating amplifier 48 and linear amplifier 49, and thin film resistors made of tantalum nitride are used in the attenuators.

The operation of this linearizer is described below. A signal inputted from an input terminal 1 of the first coupler 52 is divided into two equal signals. The divided signals are outputted from the output terminals 56 and 57, and supplied to the distortion generating amplifier 48 and linear amplifier 49, respectively, in order to be amplified. The output terminal of the distortion generating amplifier 48 is connected to the first attenuator 50, whereas the input terminal of the linear amplifier 49 is connected to the second attenuator 51. Therefore, the distortion generating amplifier 48 is saturated prior to the linear amplifier 49. The amplitude characteristics of the output signals of the distortion generating amplifier 48 and linear amplifier 49, for varying power input signals are shown by the curves A and B respectively in FIG. 13. The two output signals are outputted to the terminals 58 and 59 via the equi-power distributors 62 and 63, respectively. The outputted signals are made π radian out of phase each other before being combined in the second coupler 53. A signal formed by the signal combining is adjusted in level, and then outputted to the input terminal 60 with an amplitude characteristic shown by the curve C in FIG. 13. An output signal from the other output terminal of the second equi-power distributor 63 has the same amplitude characteristic as that of the output signal applied to the input terminal 59. The output signal is adjusted in level in the second variable attenuator 65, and then inputted to the other input terminal 61 of the fourth coupler 55 via the third coupler 54. The signals inputted to the input terminals 60 and 61 are made in phase before being combined in the fourth coupler 55. An output signal having an amplitude characteristic shown by the curve D, is obtained at an output terminal 2.

The phase characteristic of the linearizer is similar to the amplitude characteristic described above. The phase characteristics of the output signals of the distortion generating amplifier 48 and linear amplifier 49 for the power of the input signal are shown by the curves E and F in FIG. 14, respectively. A signal with a phase characteristic shown by the curve G is outputted to the input terminal 60. The signals inputted to the input terminals 60 and 61 with the phase characteristics G and F are made in phase before being combined in the fourth coupler 55. An output signal with a phase characteristic shown by the curve H, is obtained at an output terminal 2.

In general, the amplitude characteristic of an output signal of a high frequency amplifier show that the gain decreases with the increase in power of the input signal, as shown by the curve I in FIG. 15A. In a linearizer, in contrast, the gain gradually increases with the increase in power of the input signal, as shown by the curve D in FIG. 13. An ideal amplitude characteristic shown by the curve J can be obtained by connecting the linearizer to the input terminal of a high frequency amplifier. The linearizer can suppress the generation of distorted waves in the high frequency amplifier, leading to good linearity of an output signal.

With regard to the phase characteristic, a high frequency amplifier has a phase characteristic shown by the curve K in FIG. 15B, whereas the linearizer has a phase characteristic shown by the curve H. Good linearity of an output signal of the high frequency amplifier can be obtained by inputting an output signal of the linearizer to the high frequency amplifier.

Current linearizers have the above described structure, in which the couplers 52, 53, 54 and 55, and attenuators 50, 51, 64 and 65 are included. These make the linearizer large in size and costly.

The characteristics of the amplifiers 48 and 49, and attenuators 50, 51, 64 and 65 need to be adjusted according to the characteristic of an amplifier whose distorted waves are to be compensated. Considerable time is necessary for precisely adjusting the output signal of the linearizer due to its complicated structure.

The combination of the attenuators 50, 51, 64 and 65, and equi-power distributors 62 and 63 causes a very large power loss in the whole linearizer, requiring a large gain in a high frequency amplifier connected to the linearizer. Consequently, the number of sections in the high frequency amplifier needs to be increased, resulting in a decrease in the power efficiency of the high frequency amplifier.

The combination of the couplers 52, 53, 54 and 55 and attenuators 50, 51, 64 and 65 causes the applicable frequency band of the whole linearizer to be narrower than the frequency band of the individual elements.

SUMMARY OF THE INVENTION

In order to solve the above problems, the present invention provides a distortion compensation circuit (linearizer) which has a small size, reduced power loss and large applicable frequency band, and which has an output signal that is easy to adjust.

In a linearizer provided by the present invention, a semi-conductor element is used without an external direct current (D.C.) bias applied to it. The amplitude and phase characteristics of this linearizer are inverse to those of a high frequency amplifier connected successively.

In a linearizer provided by the present invention, at least one of the terminals of the semi-conductor element is grounded via a return circuit including a resistor. The amplitude and phase characteristics of an output signal are adjusted by varying the level of D.C. by changing the resistance of the resistor included in the return circuit.

In a linearizer provided by the present invention, at least one of the terminals of the semi-conductor element is grounded via a return circuit including a capacitor. The amplitude and phase characteristics of an output signal are adjusted by varying the impedance to a high frequency signal through the capacitor included in the return circuit.

In a linearizer provided by the present invention, a semi-conductor element is used with an external D.C. bias applied to one of its terminals. The amplitude and phase characteristics of an output signal are electrically adjusted by varying the external D.C. bias.

In a linearizer provided by the present invention, an external D.C. bias is applied to the semi-conductor element via a diode. The amplitude and phase characteristics of an output signal can be adjusted by controlling the polarity of D.C. by applying the external D.C. bias via the diode.

In a linearizer provided by the present invention, a variable attenuator is connected before an input circuit. The amplitude and phase characteristics of an output signal are adjusted by varying the amplitude of a high frequency signal inputted to a semi-conductor element by adjusting the attenuator.

In a linearizer provided by the present invention, an amplifier is connected before an input circuit. The amplitude and phase characteristics of an output signal are adjusted by varying the amplitude of a high frequency signal inputted to a semi-conductor element through the amplifier connected before the input circuit. This structure of the linearizer realizes reduced power loss.

In a linearizer provided by the present invention, a plurality of linearizers are serially connected by couplers. Good reflection characteristics of input and output signals are achieved by forming a balanced circuit.

In a linearizer provided by the present invention, a plurality of amplifier modules can be multi-sectionally connected, and at least one of the amplifier modules is used without an external D.C. bias applied. This structure of the linearizer realizes reduced distortion of a high frequency amplifier without connecting an external linearizer.

In a linearizer provided by the present invention, a negative D.C. bias is applied to a gate of the semi-conductor element, and a negative or positive D.C. bias below a knee voltage is applied to a drain of the semi-conductor element.

In a linearizer provided by the present invention, the D.C. bias applied to the gate or drain of the semi-conductor element is varied with temperature.

In a linearizer provided by the present invention, an input level adjusting circuit having a variable attenuator or a variable gain amplifier is connected before the input circuit.

In a linearizer provided by the present invention, an output level of the input level adjusting circuit increases with the increase in temperature.

In a linearizer provided by the present invention, an output level adjusting circuit having a variable attenuator or variable gain amplifier is connected after the output circuit as well as the input level adjusting circuit connected before the input circuit.

In a linearizer provided by the present invention, output levels of the input level and output level adjusting circuits increase with the increase in temperature.

In a linearizer provided by the present invention, a plurality of amplifier modules are multi-sectionally connected, and a D.C. bias below a knee voltage is applied to at least one of the amplifier modules.

DESCRIPTION OF THE PREFERRED EMBODIMENTS

[First embodiment]

Figure 1:
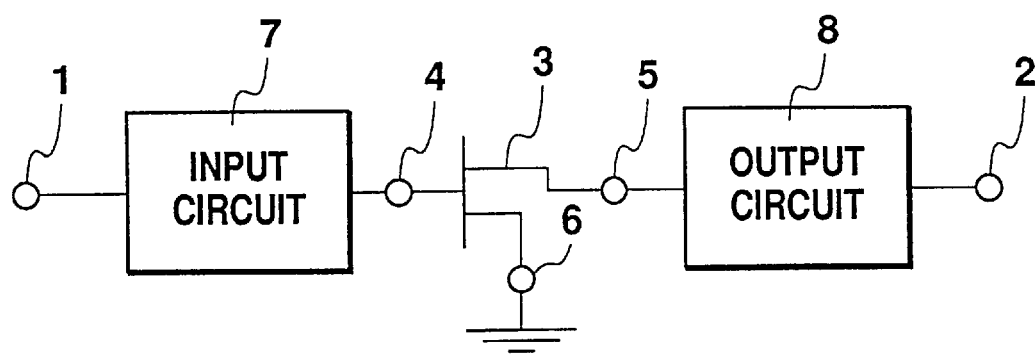
FIG. 1 shows an equivalent circuit of a distortion compensation circuit (linearizer) according to the first embodiment of the present invention.
Figure 2A:
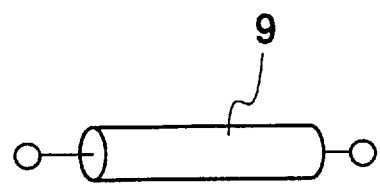
FIG. 2A shows an input or output circuit comprising transmission lines.
Figure 2B:
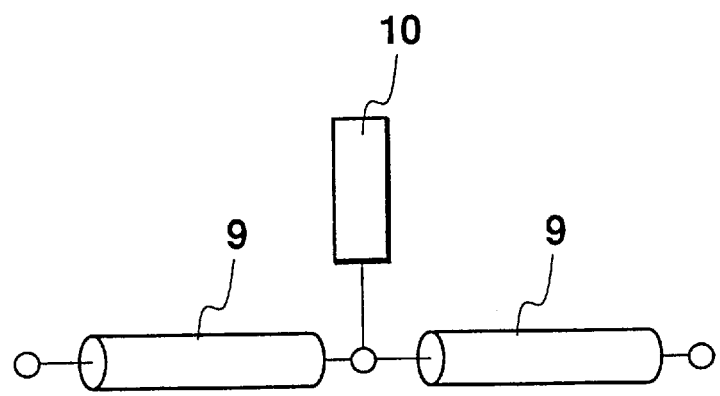
FIG. 2B shows an input or output circuit comprising transmission lines having an impedance adjusting function.

FIG. 1 shows an equivalent circuit of a distortion compensation circuit (linearizer) according to the first embodiment of the present invention. This linearizer has an input terminal 1 and output terminal 2. In this linearizer, an input circuit 7 and output circuit 8 are connected to a gate 4 and drain 5 of a semi-conductor element 3, respectively. A source 6 of the semi-conductor element 3 is grounded. An external D.C. bias is not applied to any of the gate 4, drain 5 or source 6. The input circuit 7 and output circuit 8 in this distortion circuit are used for obtaining required amplitude and phase characteristics. FIGS. 2A and 2B show examples of the input circuit 7 and output circuit 8. The circuitry shown in FIG. 2A comprises a transmission line 9 having a characteristic impedance equal to a power source impedance or load impedance. The circuitry shown in FIG. 2B comprises the transmission lines 9 and an impedance adjusting stub 10, thus implementing an impedance adjusting function.

Figure 3A:
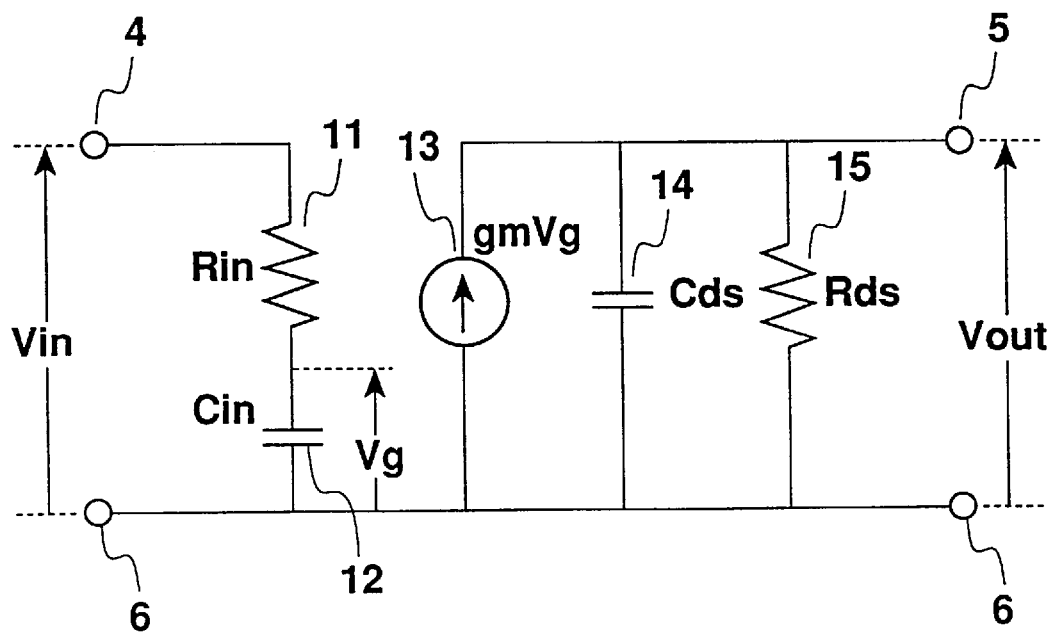
FIG. 3A shows a simplified equivalent circuit of a semi-conductor element.
Figure 3B:
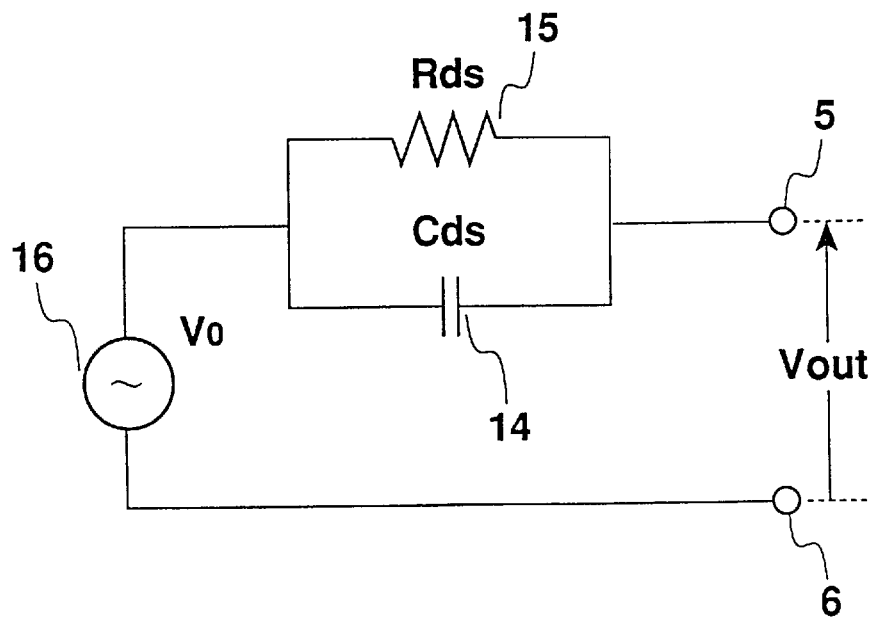
FIG. 3B shows another simplified equivalent circuit of a semi-conductor element.

The operation of the linearizer will be described. In general, semi-conductor elements having three terminals, such as FETs, are simply expressed by an equivalent circuit shown in FIG. 3A. This equivalent circuit has a resistance 11 between the gate 4 and source 6, capacitance 12 between the gate 4 and source 6, and virtual current source 13 dependent on a voltage Vg across the capacitance 12 between the gate 4 and source 6. It also has a capacitance 14 and resistance 15 between the drain 5 and source 6. When the external D.C. bias is not applied to the semi-conductor element 3 in this linearizer, the virtual current source 13 outputs a constant current. Therefore, the virtual current source 13 can be replaced with a virtual voltage supply 16. The linearizer can be expressed as an equivalent circuit shown in FIG. 3B. The transfer function of this equivalent circuit is expressed using a load impedance ZO by the following equation:

$$T = \frac{2Zo}{2Zo + \dfrac{1}{\dfrac{1}{Rds} + j\omega CdsRds}}$$

It is known that in the semi-conductor elements having three terminals, such as FETs, the increase in the voltage of an input signal is accompanied with the transfer from a linear operation to a large-signal operation, and a resistance $R_{ds}$ 15 between the drain 5 and source 6 gradually decreases with the transfer, as shown at the autumn meeting of The Institute of Electronics, Information and Communication (1993, C-24). In Equation (1) above, the amplitude $|V_{out}|$ of an output signal increases and the passing phase $\angle V_{out}$ decreases, when the resistance $R_{ds}$ 15 decreases. With the increase in the voltage of the input signal, the amplitude $|V_{out}|$ of the output signal increases, and the passing phase $\angle V_{out}$ decreases. Consequently, the amplitude and phase characteristics of the output signal for the input signal of the semi-conductor element 3 are shown by the curves D and H in FIG. 15A and FIG. 15B, respectively, as those of a current linearizer.

An ideal amplitude characteristic of the output signal shown by the curve J can be obtained by connecting the linearizer to the input terminal of a high frequency amplifier. Distorted waves generated in the amplifier can be suppressed using this linearizer to obtain an output signal having good linearity.

This linearizer is very simple compared with a conventional one. The size of the linearizer can be reduced.

The applicable frequency band of this linearizer can be extended because neither couplers nor attenuators are used.

[Second embodiment]

Figure 4:
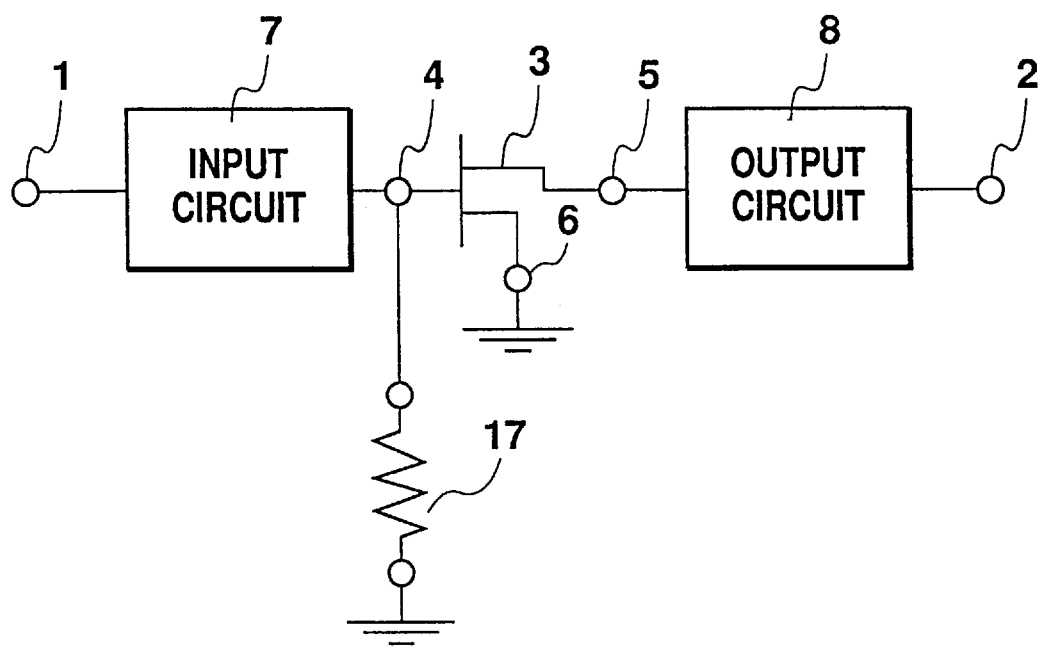
FIG. 4 shows an equivalent circuit of a linearizer according to the second embodiment of the present invention.

FIG. 4 shows an equivalent circuit of a linearizer according to the second embodiment of the present invention. The gate 4 included in a linearizer shown in the first embodiment is grounded via a return circuit including a resistance 17.

The operation, and amplitude and phase characteristics, of this linearizer are the same as those described in the first embodiment. The process for compensating the non-linearity of a high frequency amplifier successively connected to this linearizer using an output signal of the latter is also the same as that shown in the first embodiment.

In this linearizer, the level of D.C. can be varied by changing the resistance 17 included in the return circuit. The amplitude and phase characteristics of an output signal can be precisely adjusted. The amplitude and phase characteristics of the output signal are shown by the curves D and H in FIGS. 15A and 15B. They can be appropriately adjusted in response to the characteristic of a high frequency amplifier which is successively connected to the linearizer, the distortion of which is to be compensated.

[Third embodiment]

Figure 5:
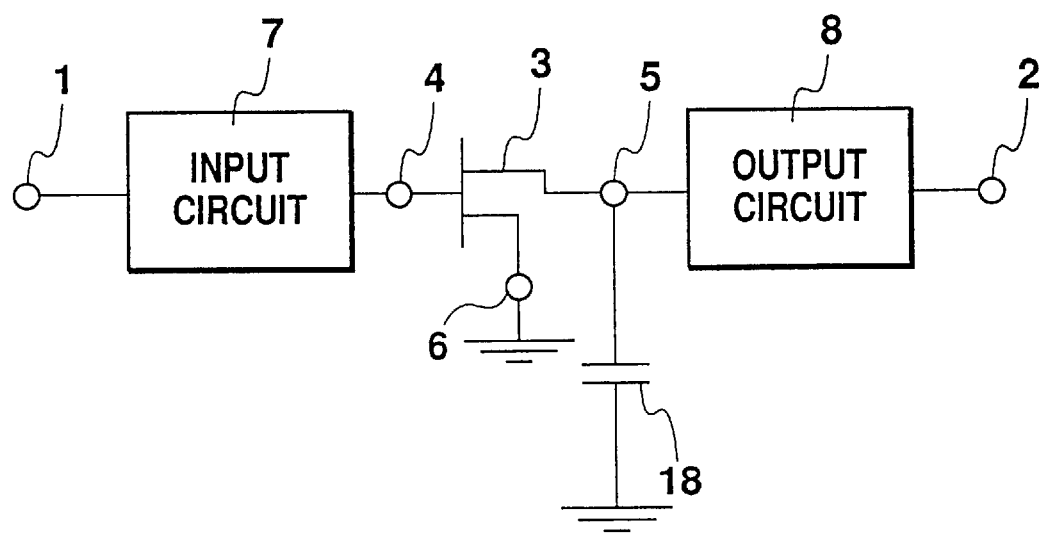
FIG. 5 shows an equivalent circuit of a linearizer according to the third embodiment of the present invention.

FIG. 5 shows an equivalent circuit of a linearizer according to the third embodiment of the present invention. The drain 5 included in a linearizer shown in the first embodiment is grounded via a return circuit including a capacitance 18.

The operation, and amplitude and phase characteristics, of this linearizer are the same as those described in the first embodiment. The process for compensating the non-linearity of a high frequency amplifier successively connected to this linearizer using an output signal of the latter is also the same as that shown in the first embodiment.

In this linearizer, a terminal of the semi-conductor element 3 is grounded via a return circuit including the capacitance 18. The amplitude and phase characteristics of an output signal can be precisely adjusted by varying the impedance for a high frequency signal. The amplitude and phase characteristics of the output signal are shown by the curves D and H in FIGS. 15A and 15B. They can be appropriately adjusted in response to the characteristic of a high frequency amplifier which is successively connected to the linearizer, the distortion of which is to be compensated.

[Fourth embodiment]

Figure 6:
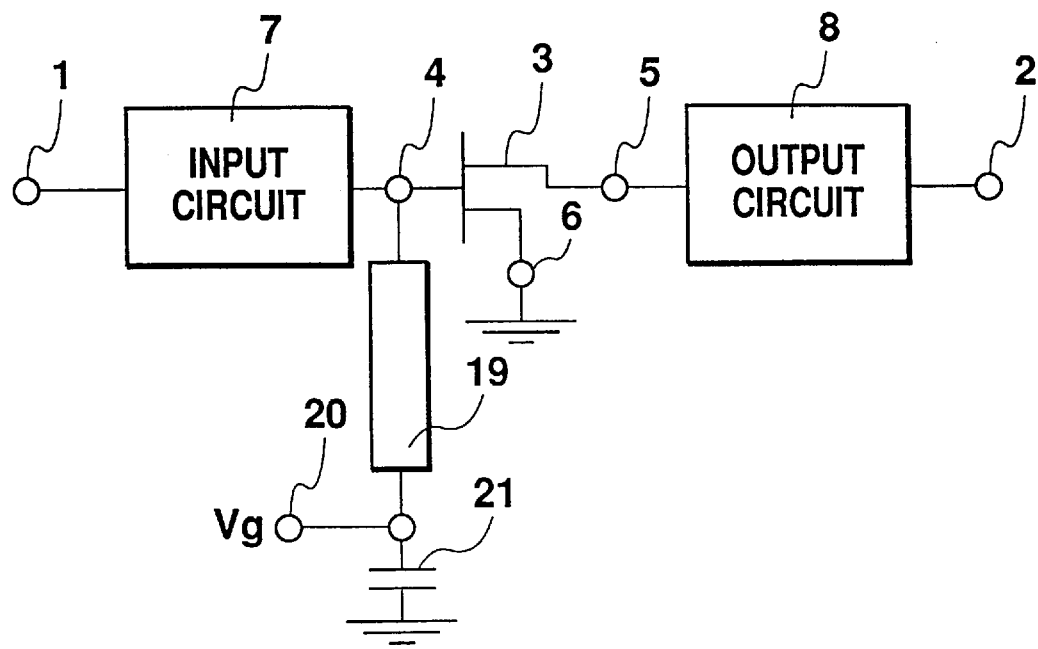
FIG. 6 shows an equivalent circuit of a linearizer according to the fourth embodiment of the present invention.

FIG. 6 shows an equivalent circuit of a linearizer according to the fourth embodiment of the present invention. A bias line 19 is connected only to the gate 4 of the semi-conductor element. An external D.C. bias Vg is applied from a terminal 20. A capacitor 21 is connected so that a high frequency signal leaking into the bias line 19 is short-circuited to the ground.

The operation, and amplitude and phase characteristics, of this linearizer are the same as those described in the first embodiment. The process for compensating the non-linearity of a high frequency amplifier successively connected to this linearizer using an output signal of the latter is also the same as that shown in the first embodiment.

In this linearizer, the amplitude and phase characteristics of an output signal can be precisely and electrically adjusted by varying the external D.C. bias applied to the gate 4 of the semi-conductor element 3. The amplitude and phase characteristics of the output signal are shown by the curves D and H in FIGS. 15A and 15B. They can be appropriately adjusted electrically in response to the characteristic of a high frequency amplifier which is successively connected to the linearizer, the distortion of which is to be compensated.

[Fifth embodiment]

Figure 7:
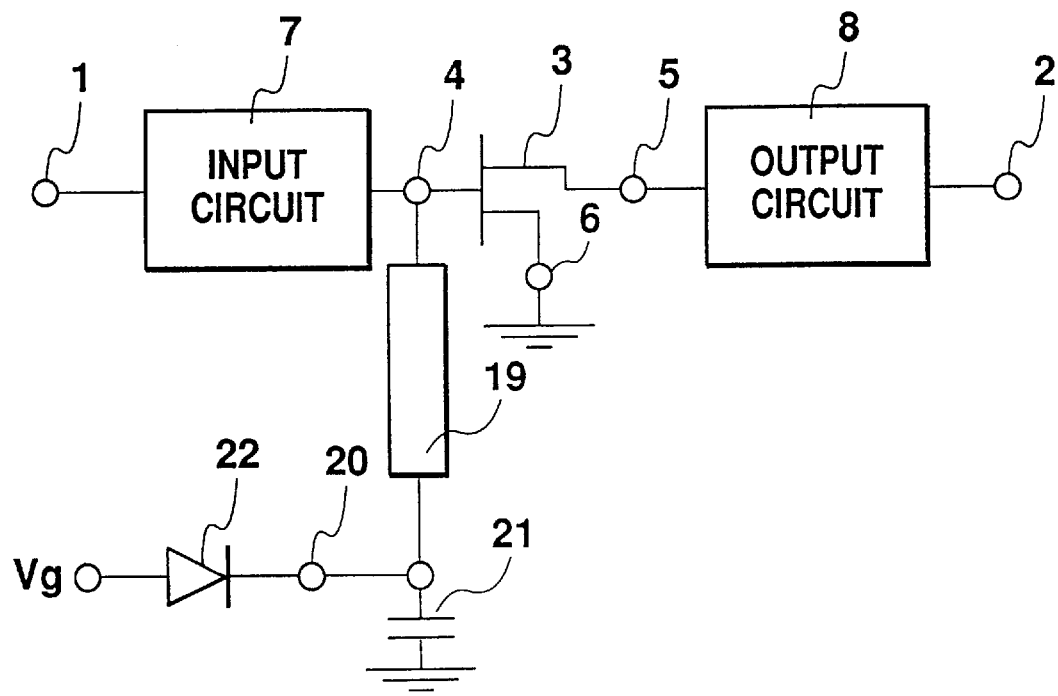
FIG. 7 shows an equivalent circuit of a linearizer according to the fifth embodiment of the present invention.

FIG. 7 shows an equivalent circuit of a linearizer according to the fifth embodiment of the present invention. A diode 22 is further included in a linearizer shown in the fourth embodiment, and the external D.C. bias vg inputted to the terminal 20 is applied via the diode 22.

The operation, and amplitude and phase characteristics, of this linearizer are the same as those described in the first embodiment. The process for compensating the non-linearity of a high frequency amplifier successively connected to this linearizer using an output signal of the latter is also the same as that shown in the first embodiment.

In this linearizer, the external D.C. bias is applied via the diode 22. The amplitude and phase characteristics of an output signal can be precisely adjusted by controlling the polarity of D.C.. The amplitude and phase characteristics of the output signal are shown by the curves D and H in FIGS. 15A and 15B. They can be appropriately adjusted in response to the characteristic of a high frequency amplifier which is successively connected to the linearizer, the distortion of which is to be compensated.

[Sixth embodiment]

Figure 8:
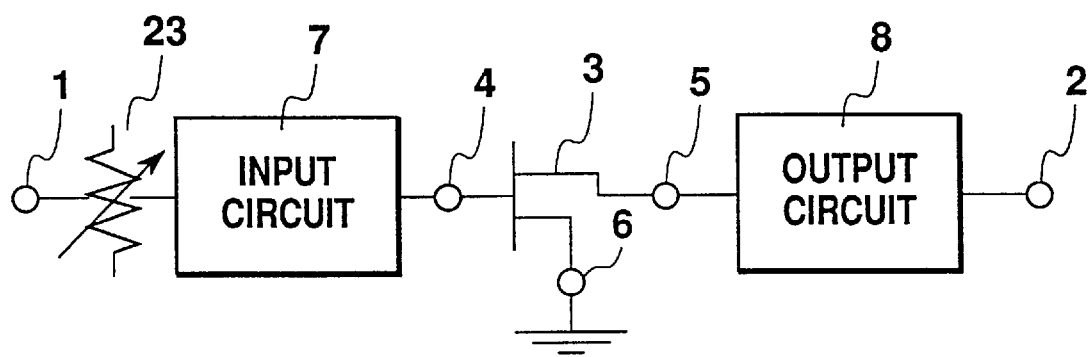
FIG. 8 shows an equivalent circuit of a linearizer according to the sixth embodiment of the present invention.

FIG. 8 shows an equivalent circuit of a linearizer according to the sixth embodiment of the present invention. A variable attenuator 23 connected before the input circuit 7 is further included in a linearizer shown in the first embodiment.

The operation, and amplitude and phase characteristics, of this linearizer are the same as those described in the first embodiment. The process for compensating the non-linearity of a high frequency amplifier successively connected to this linearizer using an output signal of the latter is also the same as that shown in the first embodiment.

In this linearizer, the amplitude and phase characteristics of an output signal can be precisely adjusted by varying the amplitude of a high frequency signal inputted to the semi-conductor element 3 by changing the attenuation at the attenuator 23. The amplitude and phase characteristics of the output signal are shown by the curves D and H in FIGS. 15A and 15B. They can be appropriately adjusted in response to the characteristic of a high frequency amplifier which is successively connected to the linearizer, the distortion of which is to be compensated.

[Seventh embodiment]

Figure 9:
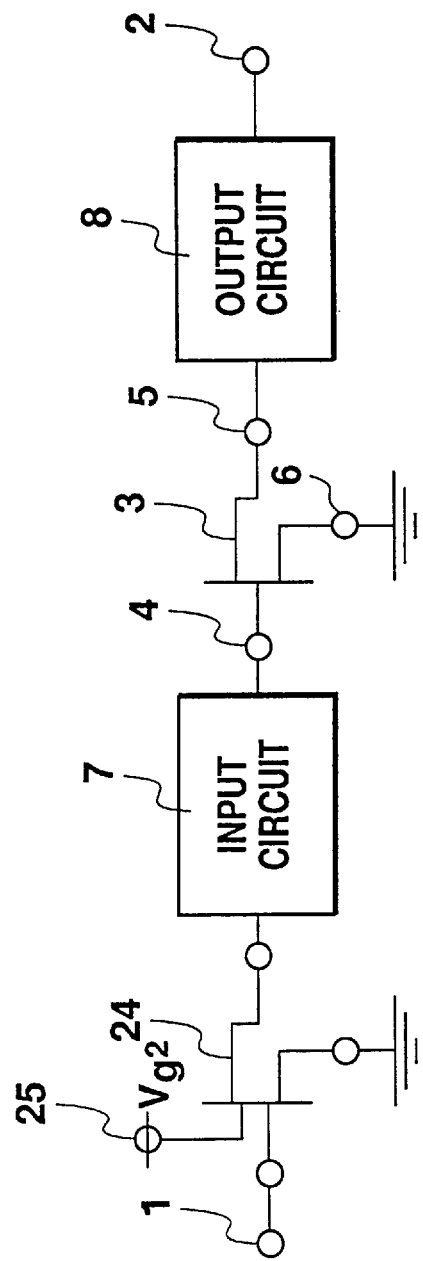
FIG. 9 shows an equivalent circuit of a linearizer according to the seventh embodiment of the present invention.

FIG. 9 shows an equivalent circuit of a linearizer according to the seventh embodiment of the present invention. A dual gate FET 24 connected before the input circuit 7 is further included in a linearizer shown in the first embodiment.

The operation, and amplitude and phase characteristics of this linearizer are the same as those described in the first embodiment. The process for compensating the non-linearity of a high frequency amplifier successively connected to this linearizer using an output signal of the latter is also the same as that shown in the first embodiment.

In this linearizer, the dual gate FET 24 is connected before the input circuit 7. The amplitude and phase characteristics of an output signal can be precisely and electrically adjusted by varying the amplitude of a high frequency signal inputted to the semi-conductor element 3 by adjusting a voltage $Vg_2$ applied to a second gate 25. The amplitude and phase characteristics of the output signal are shown by the curves D and H in FIGS. 15A and 15B. They can be appropriately adjusted electrically in response to the characteristic of a high frequency amplifier which is successively connected to the linearizer, the distortion of which is to be compensated.

The reflection characteristic of this linearizer can be improved by matching an input line impedance to the input impedance of the dual gate FET 24.

Reduced power loss can be realized by the dual gate FET 24 connected before the input circuit 7 in this linearizer.

[Eighth embodiment]

Figures 10A, 10B:
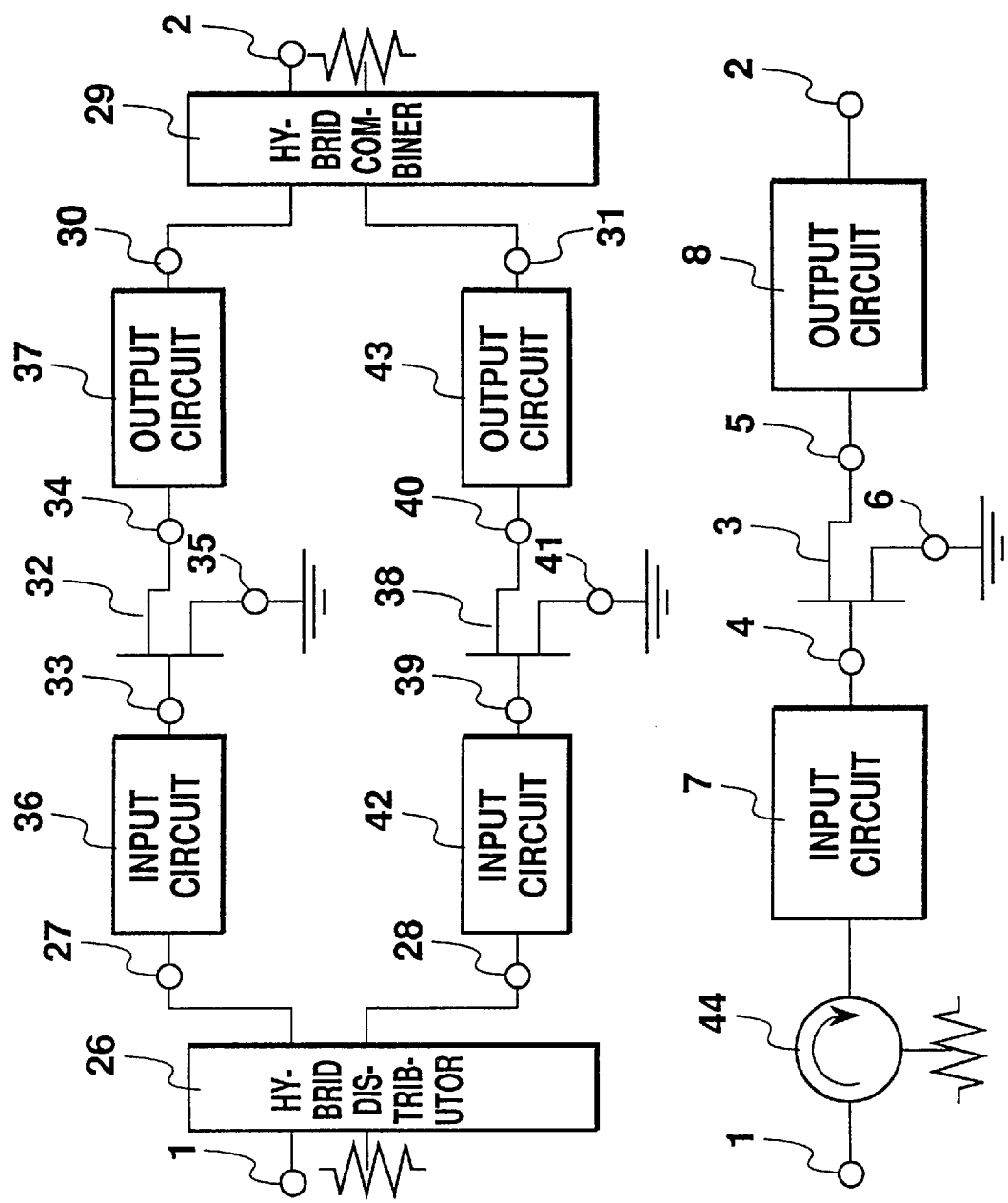
FIG. 10A shows an equivalent circuit of a linearizer according to the eighth embodiment of the present invention.
FIG. 10B shows another equivalent circuit of a linearizer according to the eighth embodiment of the present invention.

FIG. 10A shows an equivalent circuit of a linearizer according to the eighth embodiment of the present invention. This linearizer has the input terminal 1 and a hybrid distributor 26. A first input circuit 36, first semi-conductor element 32 and first output circuit are successively connected to an output terminal 27 of the hybrid distributor 26. A second input circuit 36, second semi-conductor element 32 and second output circuit are successively connected to another output terminal 28 of the hybrid distributor 26. The first and second output circuits 37 and 43 are connected to input terminals 30 and 31 of a hybrid combiner 29, respectively.

FIG. 10B shows an equivalent circuit of another linearizer according to the eighth embodiment of the present invention. An isolator 44 is further included in a linearizer shown in the first embodiment.

The operation, and amplitude and phase characteristics, of this linearizer are the same as those described in the first embodiment. The process for compensating the non-linearity of a high frequency amplifier successively connected to this linearizer using an output signal of the latter is also the same as that shown in the first embodiment.

The reflection characteristic at the input and output terminals 1 and 2 can be improved using the hybrid distributor 26 and combiner 29. Therefore, a linearizer with an improved reflection characteristic can be realized.

[Ninth embodiment]

Figure 11:
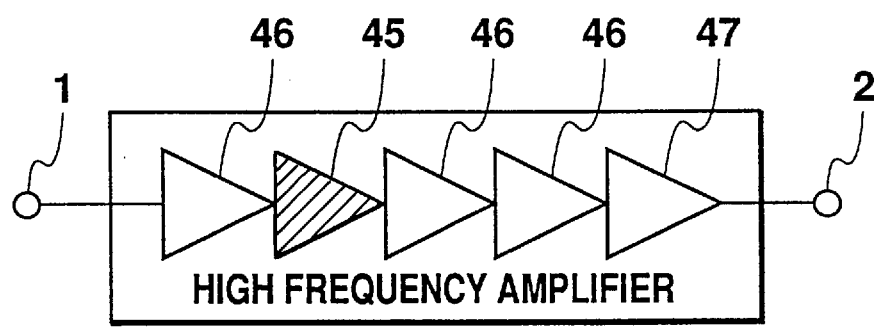
FIG. 11 shows a block diagram of a high frequency amplifier having a linearizer according to the ninth embodiment of the present invention.
Figure 12:
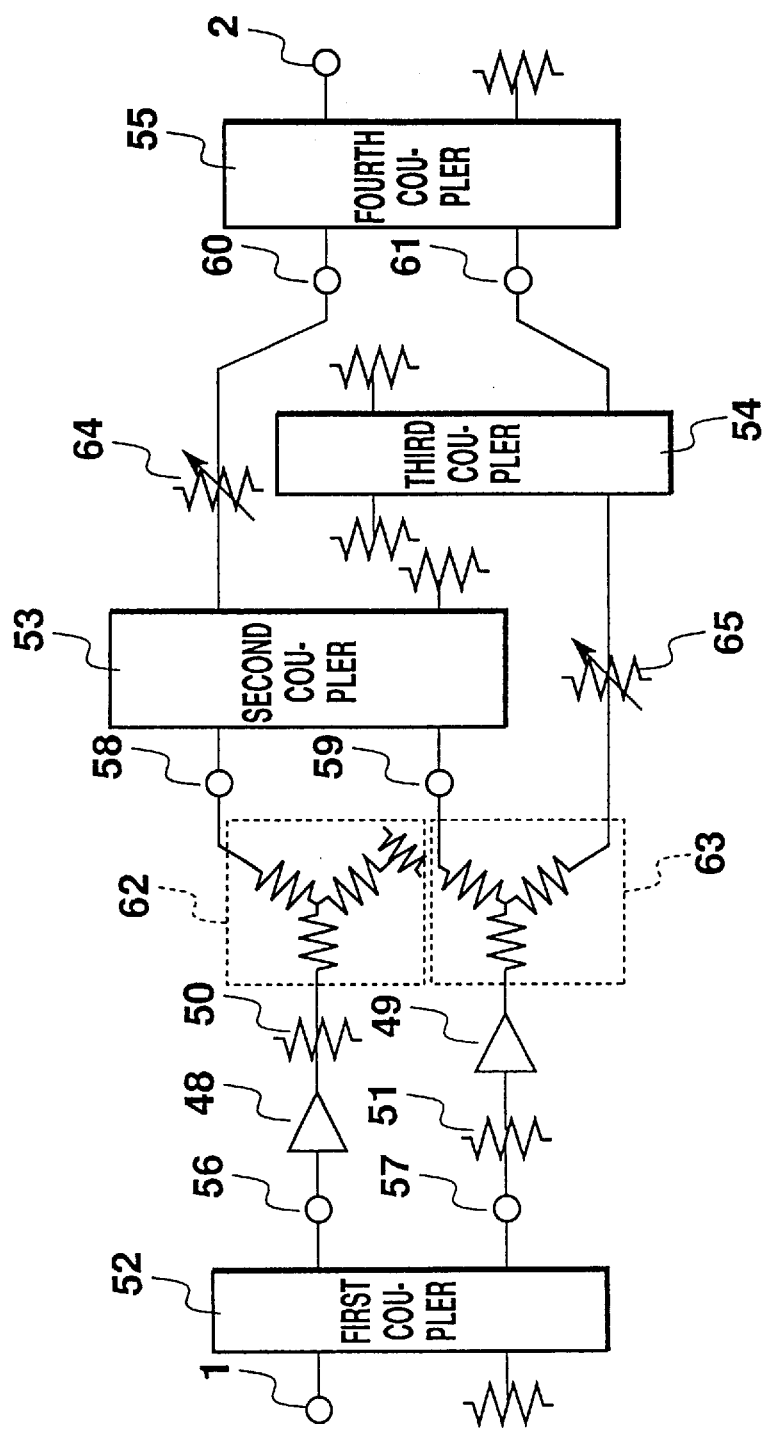
FIG. 12 shows an equivalent circuit of a conventional linearizer.
Figure 13:
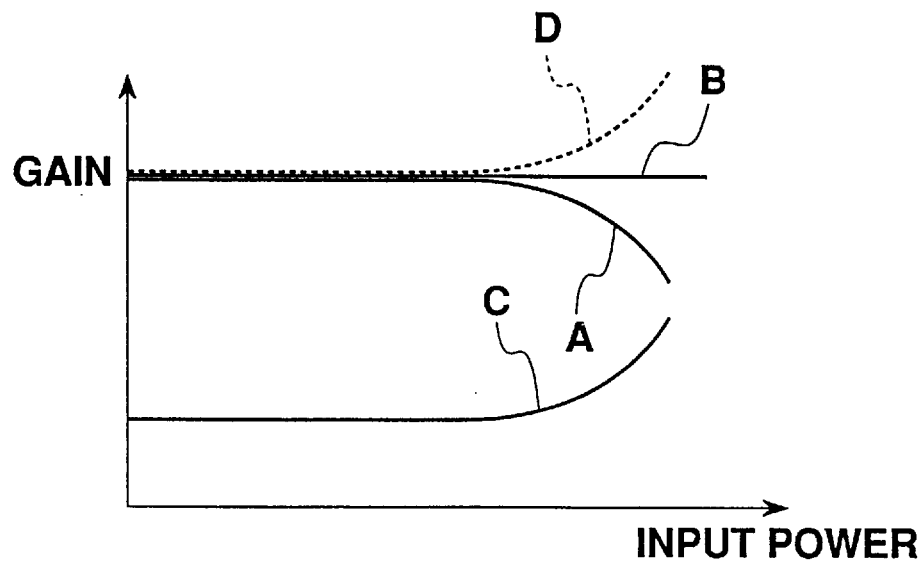
FIG. 13 represents the operation of a conventional linearizer using an amplitude characteristic for input power.
Figure 14:
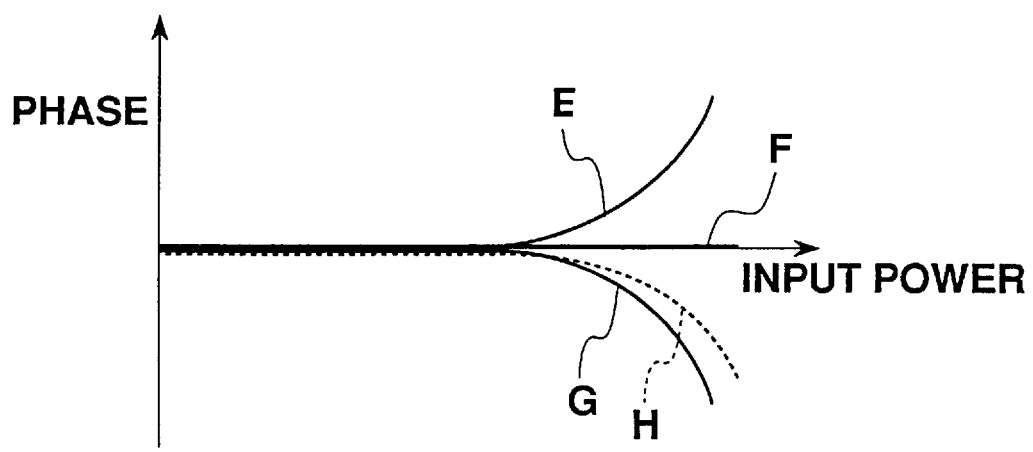
FIG. 14 represents the operation of a conventional linearizer using a phase characteristic for input power.

FIG. 11 shows a block diagram of a high frequency amplifier including a linearizer according to the ninth embodiment of the present invention. In this amplifier, the input and output terminals 1 and 2 are included, and an amplifier module 45 to which a D.C. bias is not applied, other amplifier modules 46 and a high power output amplifier 47 are serially connected.

Figure 15A:
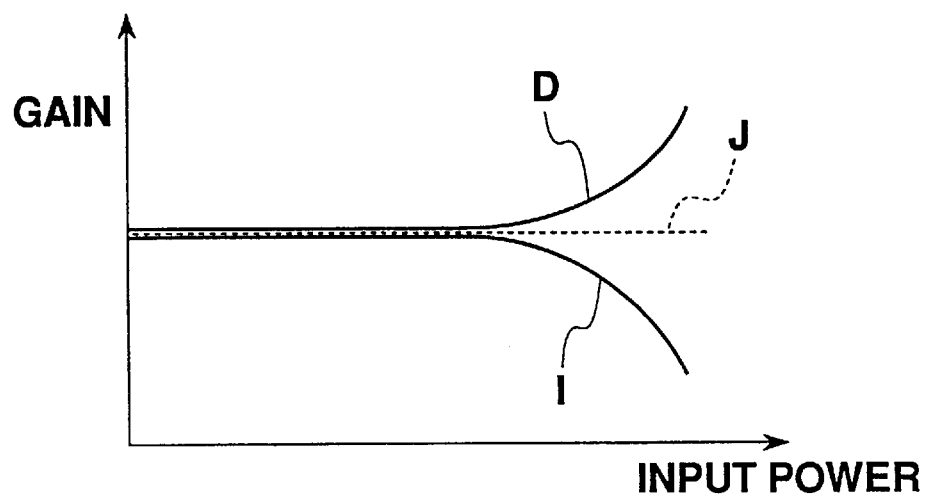
FIG. 15A represents distortion compensation for a high frequency amplifier by a current linearizer using an amplitude characteristic for input voltage.
Figure 15B:
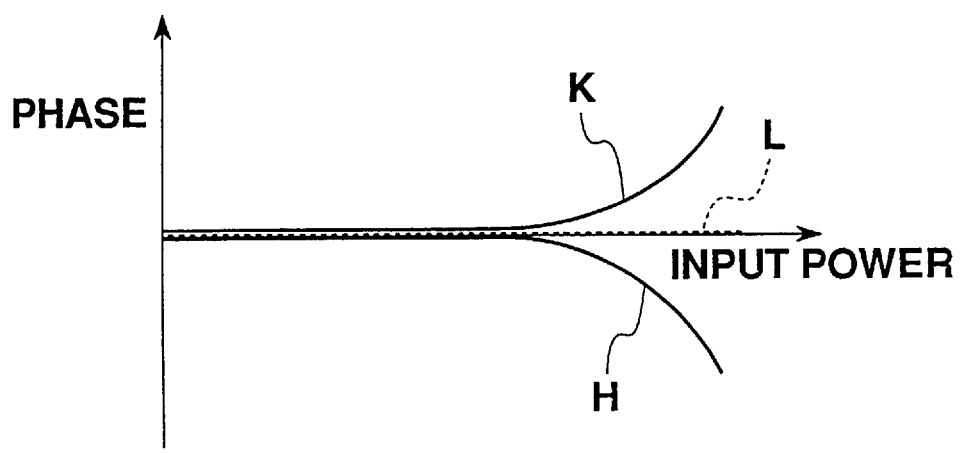
FIG. 15B represents distortion compensation for a high frequency amplifier by a current linearizer using a phase characteristic for input voltage.

An output signal of the amplifier module 45 to which an external D.C. bias is not applied has amplitude and phase characteristics shown by the curves D and H in FIGS. 15A and 15B, the same as those of a linearizer shown in the first embodiment. An output signal of the high power output amplifier 47 connected after the amplifier module 45 has amplitude and phase characteristics shown by the curves I and K. The output signal of the high power output amplifier 47 is compensated by the output signal of the amplifier module 45, and the amplitude and phase characteristics of the compensated output signal is much improved to have good linearity shown by the curves J and L.

In this linearizer, the external D.C. bias is not applied to the respective amplifier modules 46 included in a high frequency amplifier module. The amplifier modules are used as linearizers. This structure can suppress distorted waves generated by the connected high frequency amplifier, as a current linearizer connected externally. This structure permits a linearizer to be smaller and less costly.

[Tenth embodiment]

Figure 16:
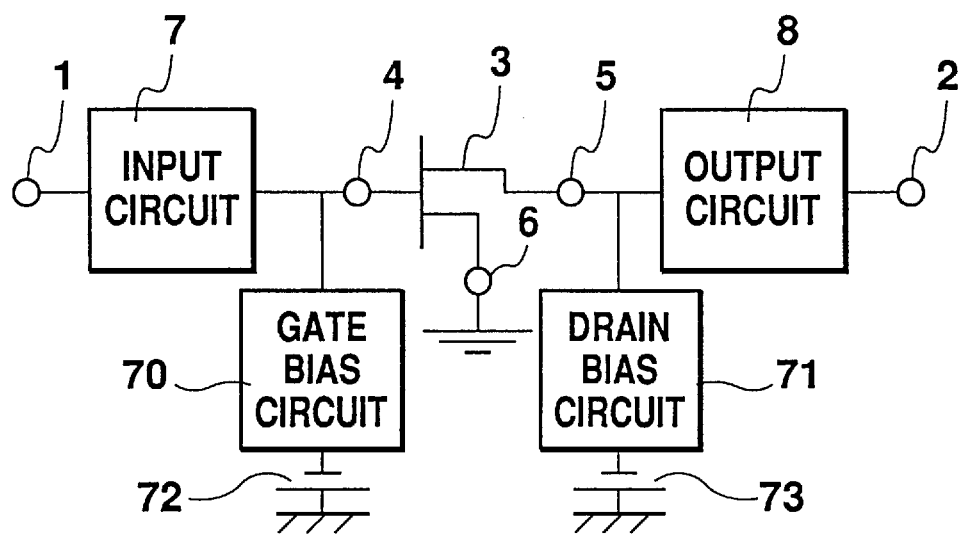
FIG. 16 shows an equivalent circuit of a linearizer according to the tenth embodiment of the present invention.

FIG. 16 shows an equivalent circuit of a linearizer according to the tenth embodiment of the present invention. This linearizer has the input terminal 1, output terminal 2, semi-conductor element 3 having the gate 4, drain 5 and source 6, input circuit 7, and output circuit 8. It further comprises a gate bias circuit 70, drain bias circuit 71 and D.C. power supplies 72 and 73.

In this linearizer, the source 6 is grounded, the input circuit 7 is connected to the gate 4 and the output circuit 8 is connected to the drain 5. The gate bias circuit 70 and drain bias circuit 71 are connected to gate 4 and drain 5 in order to apply desired D.C. biases to the gate 4 and drain 5, respectively.

Figure 17A:
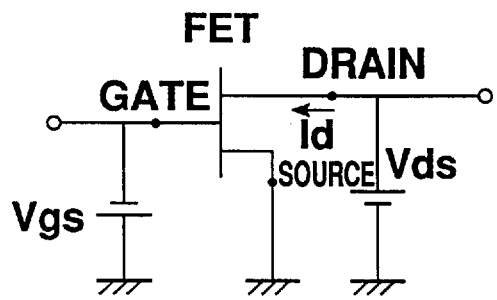
FIG. 17A shows a circuit representing the connection of an FET.
Figure 17B:
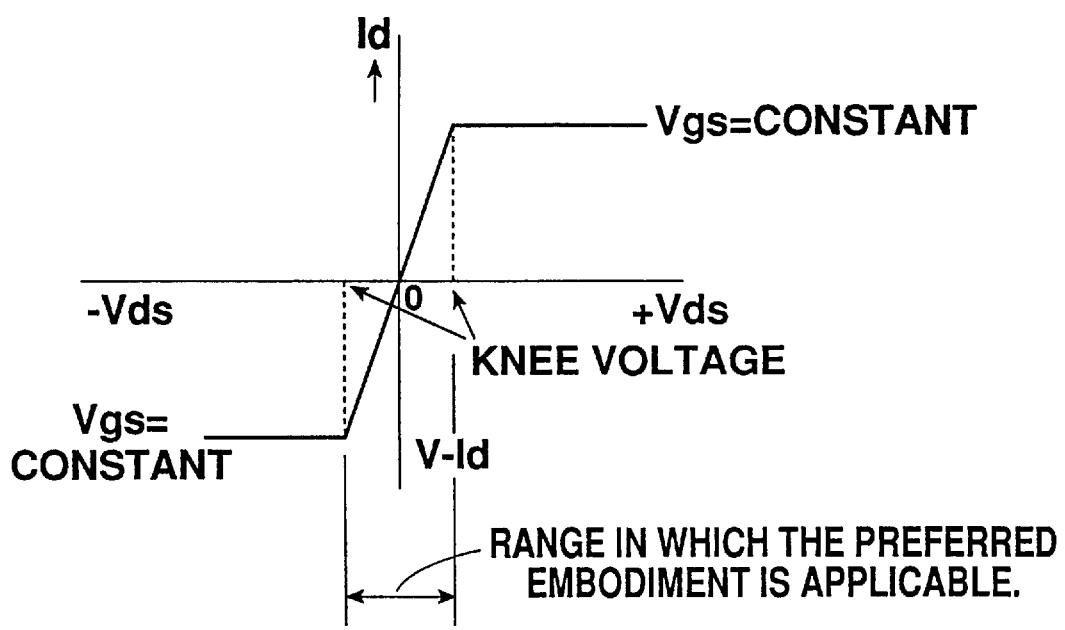
FIG. 17B shows the static characteristic and a knee voltage of the FET shown in FIG. 17A.

A negative D.C. bias is applied to the gate 4 of the semi-conductor element 3 via the gate bias circuit 70 by the D.C. power supply 72. A negative or positive D.C. bias is applied to the drain 5 via the drain bias circuit 71 by the D.C. power supply 73. The voltage of the D.C. bias supplied to the drain is usually in the higher range of 3 to 10 V, whereas that in this linearizer is in the lower range below a knee voltage (for example, −1.5 to +1.5 V). This makes it possible to obtain the non-linearity of the semi-conductor element 3. FIG. 17 represents a knee voltage of an FET. FIG. 17A shows a circuit representing the connection of the FET, and FIG. 17B shows the static characteristic of the FET.

Figure 18A:
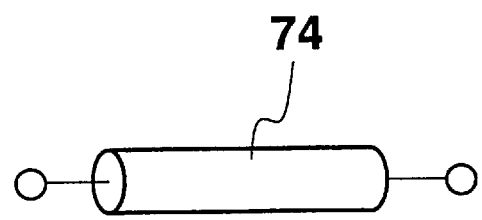
FIG. 18A shows an input or output circuit comprising transmission lines.
Figure 18B:
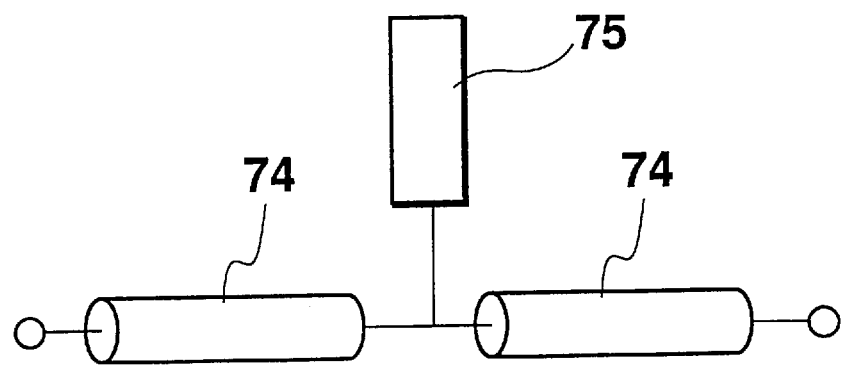
FIG. 18B shows an input or output circuit comprising transmission lines having an impedance adjusting function.

The input circuit 7 and output circuit 8 used in this linearizer are for obtaining desired amplitude and phase characteristics, as shown in FIG. 18. In FIG. 18A, transmission lines 74 having a characteristic impedance equal to a source impedance or load impedance (for example, 50 Ω) are used. In FIG. 18B, an impedance adjusting stub 75 and transmission lines 74 are used for adjusting the impedance of the circuits.

The operation of the linearizer will be described. In general, a semi-conductor element having three terminals, such as a FET or HEMT, can be simply expressed by an equivalent circuit shown in FIGS. 3A and 3B. The transfer function of the equivalent circuit is also expressed by the Equation (1) using a load impedance Z0.

It is known that in the semi-conductor elements having three terminals, such as a FET or HEMT, the increase in the voltage of an input signal is accompanied with the transfer from a linear operation to a large-signal operation, and a resistance $R_{ds}$ between the drain 5 and source 6 gradually decreases with the transfer, as shown at the autumn meeting of The Institute of Electronics, Information and Communication (1993, C-24). In Equation (1) above, the amplitude $|V_{out}|$ of an output signal increases and the passing phase $\angle_{out}$ decreases, when the resistance $R_{ds}$ decreases. With the increase in the voltage of the input signal, the amplitude $|V_{out}|$ of the output signal increases, and the passing phase $\angle V_{out}$ decreases. Consequently, the amplitude and phase characteristics of the output signal for the input signal of the semi-conductor element 3 are shown by the curves D and H in FIGS. 15A and 15B, respectively, as those of a current linearizer.

In this linearizer, a D.C. bias below a knee voltage is supplied to the drain 5 of the semi-conductor element 3. This enables the amplitude and phase characteristics of the linearizer to be inverse to those of a high power amplifier whose output signal is to be compensated. An output signal of the high power amplifier has such good linearity as shown by the curves J and L in FIGS. 15A and 15B when the linearizer is connected to the input terminal of the high power amplifier.

The linearizer according to this preferred embodiment of the present invention does not require as many couplers and attenuators as are used in a conventional linearizer, leading to a very simple circuit. This enables the size of the linearizer to be made smaller, and its applicable frequency band to be made wider. The power consumption of the linearizer can be reduced, because only a low D.C. bias is applied to the semi-conductor element 3.

[Eleventh embodiment]

Figure 19A:
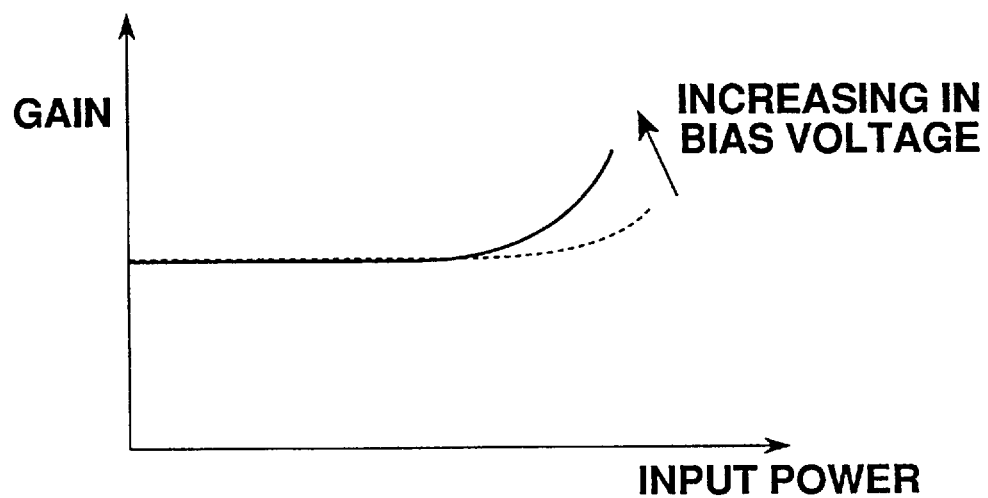
FIG. 19A shows gain plotted against the D.C. bias voltage in a linearizer according to the eleventh embodiment of the present invention.
Figure 19B:
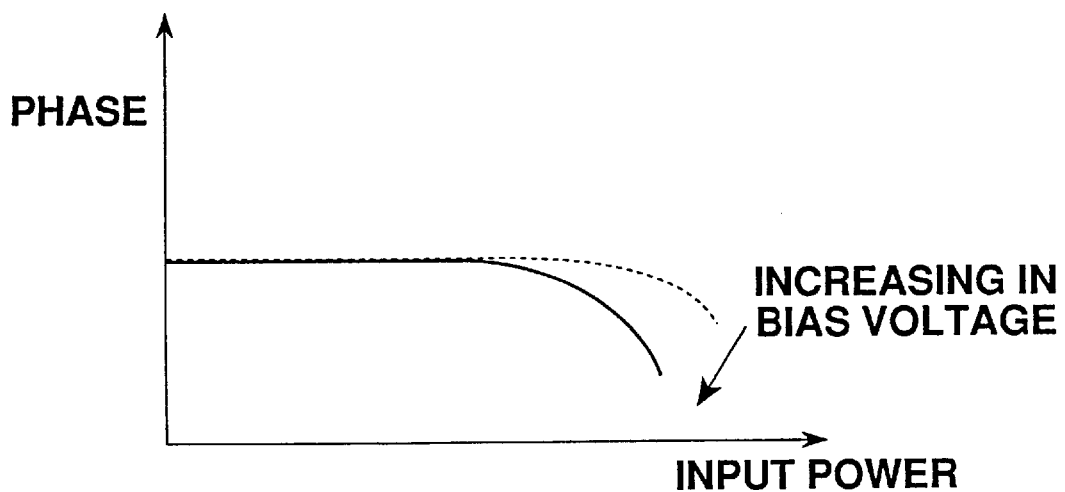
FIG. 19B shows phase plotted against the D.C. bias voltage in a linearizer according to the eleventh embodiment of the present invention.

FIGS. 19A and 19B shows the dependence of an output signal of a linearizer according to the eleventh embodiment of the present invention on D.C. bias. In FIGS. 19A and 19B, the amplitude and phase characteristics of the output signal of a linearizer are shown when the D.C. bias $V_{ds}$ applied to the drain 5 is varied in the range of 0 to 0.5 V.

In an semi-conductor element having three terminals, such as a FET or HEMT, the relationship between a drain current and drain voltage is generally non-linear in the range of the drain voltage below a knee voltage. A resistance $R_{ds}$ 15 between the drain 5 and source 6 in a high frequency band is almost determined by the slope of the drain current plotted against the drain voltage. The resistance $R_{ds}$ 15 between the drain 5 and source 6 in a high frequency band can be varied by changing the setting of the drain voltage. The amplitude and phase characteristics shown by the solid curves in FIGS. 19A and 19B are changed to those shown by the broken curves by varying the drain voltage, the D.C. bias applied to the drain 5, from 0 to −0.5 V.

Figure 20A:
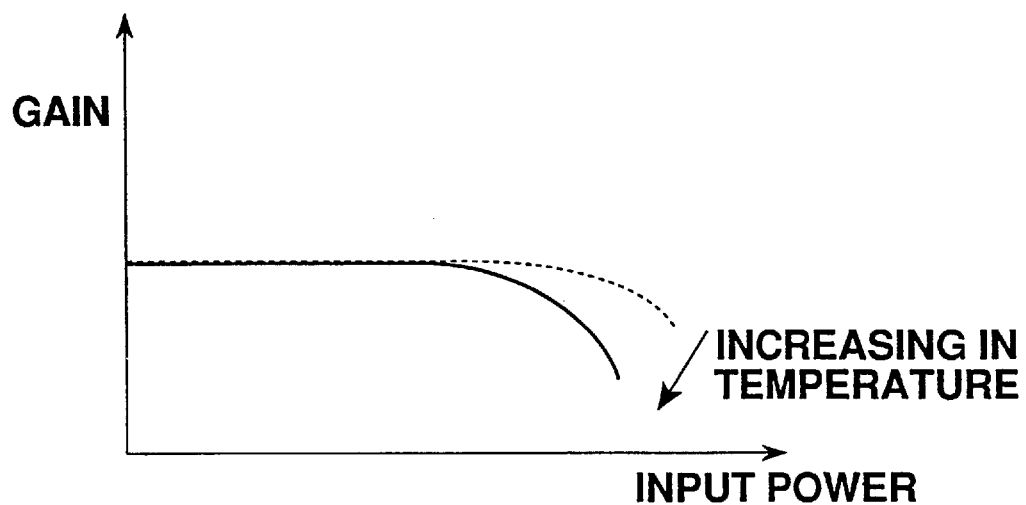
FIG. 20A shows the temperature-dependence of the gain of a high frequency amplifier according to the eleventh embodiment of the present invention.
Figure 20B:
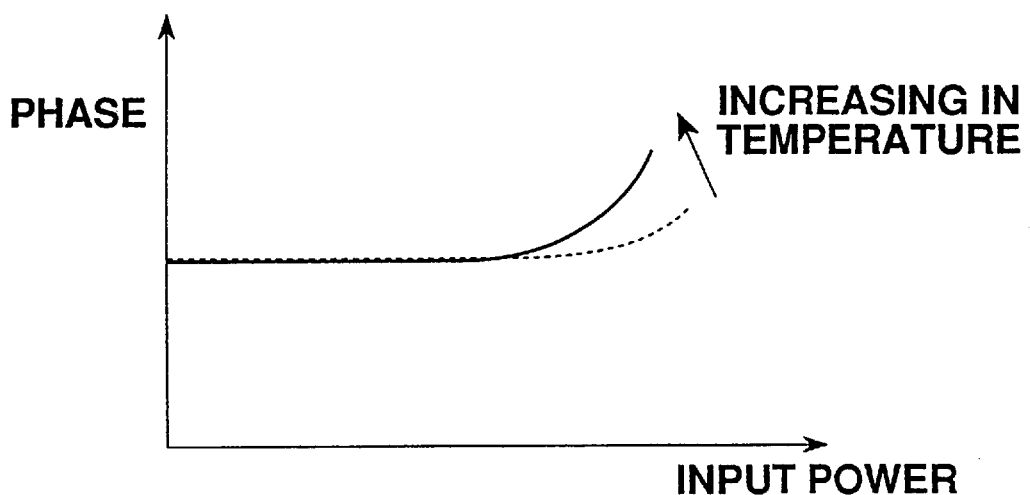
FIG. 20B shows the temperature-dependence of the phase of a high frequency amplifier according to the eleventh embodiment of the present invention.

FIGS. 20A and 20B exemplify the dependence of the amplitude and phase characteristics of a high power amplifier on temperature. The resistance $R_{ds}$ of the semi-conductor element 3 used as the high power amplifier, generally becomes large at a high temperature, being widely varied with the change in the input power. Consequently, the variation in the amplitude and phase characteristics increases at a higher temperature compared with that at a lower temperature.

The distortion compensation for a high power amplifier requires a linearizer which can adjust its own amplitude and phase characteristics. In a linearizer provided by the present invention, the amplitude and phase characteristics can be changed by varying the drain voltage, as shown in FIGS. 19A and 19B. When the D.C. bias applied to the semi-conductor element 3 is set to be large at a high temperature, ideal amplitude and phase characteristics as shown in FIGS. 15A and 15B, can be obtained over a wide range of temperature.

As described above, the distortion compensation for the high power amplifier over a wide temperature range can be achieved by changing the D.C. bias applied to the semi-conductor element 3.

[Twelfth embodiment]

Figure 21A:
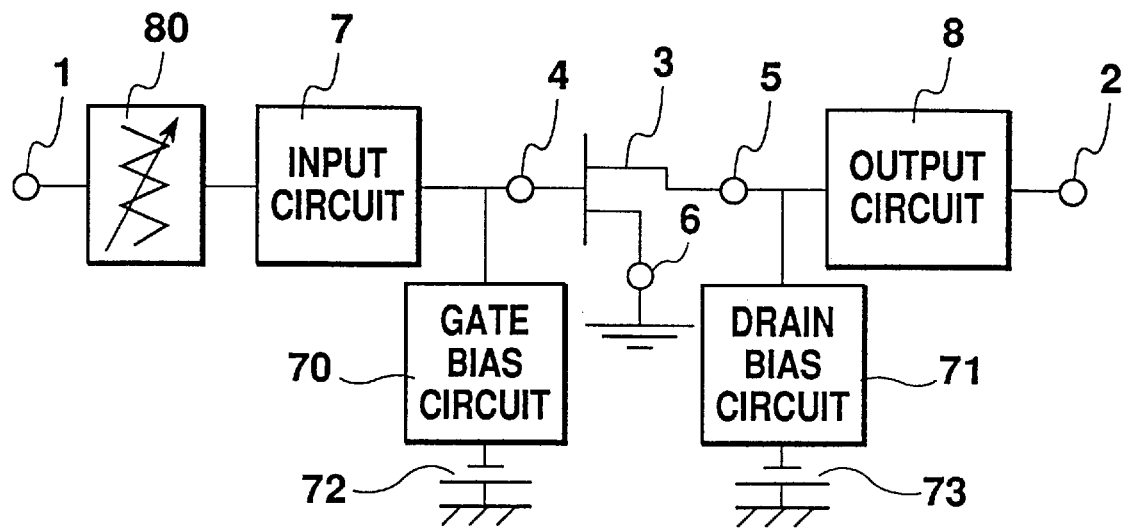
FIG. 21A shows an equivalent circuit of a linearizer according to the twelfth embodiment of the present invention.
Figure 21B:
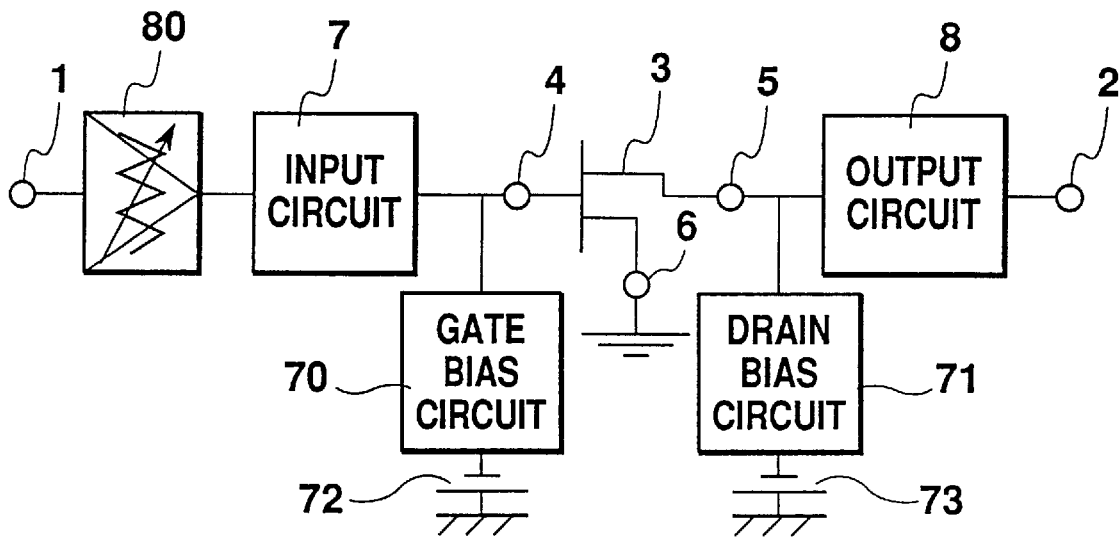
FIG. 21B shows another equivalent circuit of a linearizer according to the twelfth embodiment of the present invention.

FIGS. 21A and 21B show the structure of a linearizer according to this embodiment of the present invention. In FIG. 21A, a variable attenuator, used as an input level adjusting circuit 80, is connected before the input circuit in the linearizer shown in FIG. 16. In FIG. 21B, a variable gain amplifier is connected before the input circuit.

In general, the semi-conductor elements 3 used in the linearizer have unevenness in their characteristics. The input power at which the amplitude and phase characteristics of the linearizer is changed from a straight line to a curve, shown by the curves I and H in FIG. 15, is different for the respective semi-conductor elements 3. For example, the input power at which the amplitude and phase characteristics of the linearizer are changed from a straight line to a curve, is smaller when using a semi-conductor element 3 of high gain. Although the input power supplied to the semi-conductor element 3 is constant, the amplitude and phase characteristics of the linearizer can vary due to the unevenness of the characteristics of the semi-conductor element 3.

In order to solve the above problem, the input level adjusting circuit 80 comprising the variable attenuator is connected to the input terminal of the input circuit 7 in the linearizer shown in FIG. 21A. The amplitude of a high frequency signal inputted to the semi-conductor element 3 can be adjusted by appropriately changing the attenuation in the input level adjusting circuit 80 according to the characteristics of the semi-conductor element 3.

Preferable amplitude and phase characteristics of the linearizer can be obtained if the characteristics of the semi-conductor elements 3 used there are uneven. The process for compensating the non-linearity of a high power amplifier using the linearizer, which is connected after the high power amplifier, is the same as that using the linearizer described in the tenth preferred embodiment.

In FIG. 21B, a variable gain amplifier comprising a dual gate FET is used as the input level adjusting circuit 80.

In the linearizer in which the variable attenuator is used as the input level adjusting circuit 80, the absolute value of the power inputted to the semi-conductor element 3 is predetermined. Therefore, it has an advantage when the power supplied to the input terminal 1 of the linearizer is large. In contrast, when the power supplied to the input terminal 1 of the linearizer is small, the linearizer using the variable gain amplifier, shown in this preferred embodiment, has a great advantage. Furthermore, even when the characteristics of the semi-conductor element 3 fluctuate, it can be operated at a preferable input power by changing the gain of the variable gain amplifier.

As described above, the input level adjusting circuit 80 comprising the variable attenuator or variable gain amplifier is connected before the input circuit 7. This enables a preferable input power appropriate to the characteristics of the semi-conductor element to be applied to it, realizing a linearizer having more uniform distortion compensation.

[Thirteenth embodiment]

In this embodiment, the output level of the input level adjusting circuit 80 shown in the thirteenth embodiment is set to increase with the increase in temperature.

Figure 22A:
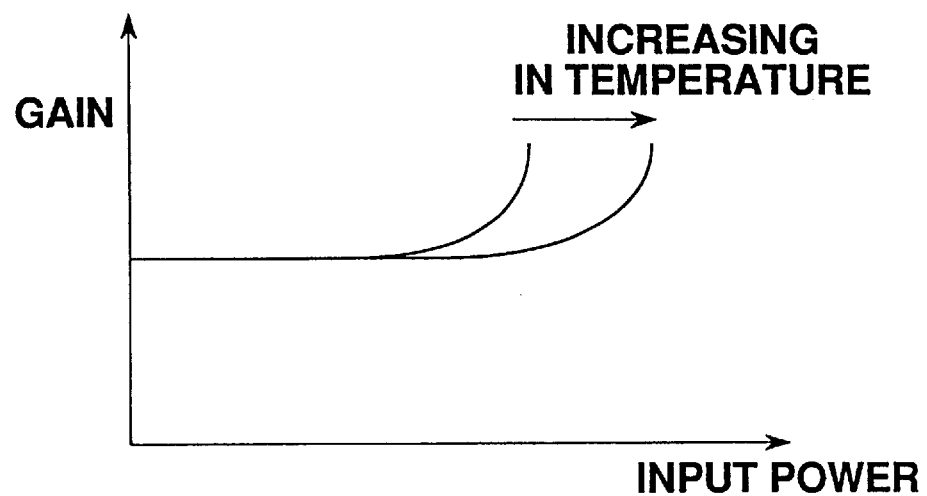
FIG. 22A shows temperature-dependence of the gain of a linearizer according to the thirteenth embodiment of the present invention.
Figure 22B:
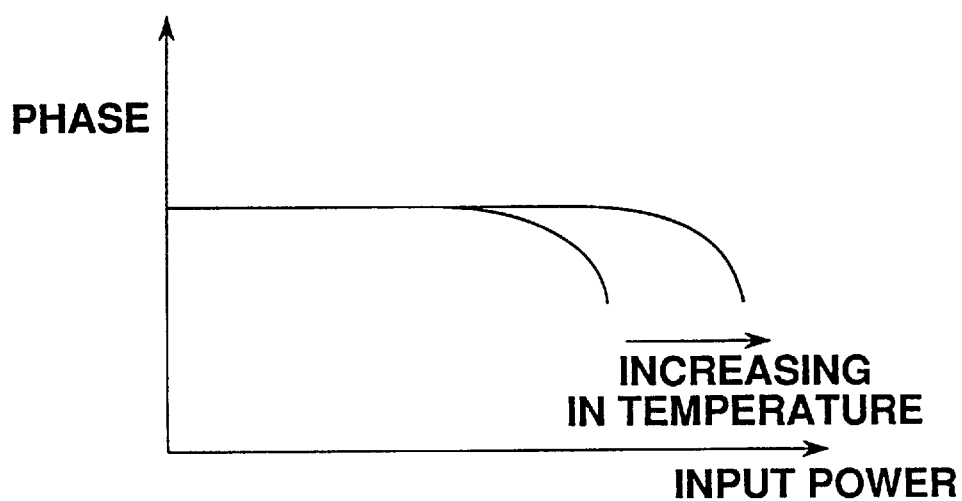
FIG. 22B shows temperature-dependence of the phase of a linearizer according to the thirteenth embodiment of the present invention.

In general, the characteristics of the semi-conductor element used in the linearizer are changed by the variation in temperature. For example, in the linearizer without the input level adjusting circuit 80 connected (shown in FIG. 16), its amplitude and phase characteristics are changed by the variation in temperature, as shown FIG. 22A and 22B. The amplitude and phase characteristics of the semi-conductor element 3 are caused to change from linear to non-linear at a lower input level at a higher temperature.

In order to solve the above problem, at a higher temperature, the attenuation in the variable attenuator is decreased, or the gain in the variable gain amplifier is increased. This enables the power inputted to the semi-conductor element 3 to be larger at a higher temperature, even when the power inputted to the linearizer is constant. Preferable amplitude and phase characteristics are constantly achieved, irrespective of various temperatures, realizing a linearizer less affected by temperature.

The process for compensating the non-linearity of a high power amplifier using the linearizer, which is connected after the high power amplifier, is the same as that using the linearizer described in the tenth preferred embodiment.

[Fourteenth embodiment]

Figure 23:
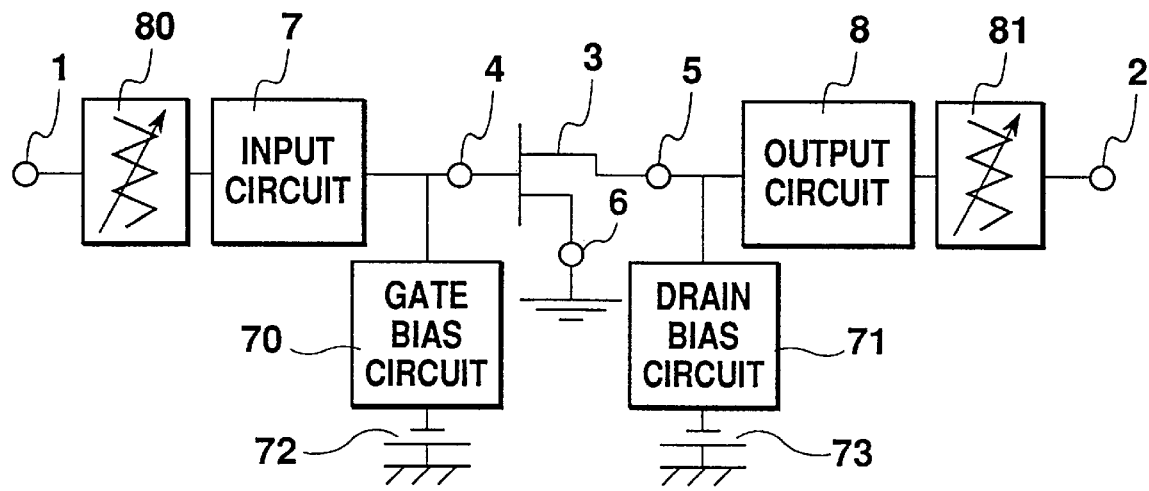
FIG. 23 shows an equivalent circuit of a linearizer according to the fourteenth embodiment of the present invention.

FIG. 23 shows the structure of a linearizer according to this embodiment of the present invention. In this linearizer, an output level adjusting circuit 81 comprising a variable attenuator or a variable gain amplifier is connected after the output circuit 8 in the linearizer shown in FIG. 21. In general, a high power amplifier whose distortion is compensated, has a gain varied due to unevenness of the characteristics of semi-conductor elements used in the high power amplifier. When the distortion of the high power amplifier is compensated by connecting a linearizer before it, the level of a signal inputted to the high power amplifier needs to be appropriately adjusted according to the gain of the high power amplifier.

The output level adjusting circuit 81 is connected after the output circuit 8, and the attenuation or gain is made variable. This enables the level of the signal inputted to the high power amplitude to be a preferable value. Good distortion compensation is realized, even when the gain of the high power amplifier is not constant.

The input level adjusting circuit 80 connected before the input circuit 7 is used for compensating the characteristics of the semi-conductor element 3 used in the linearizer.

[Fifteenth embodiment]

In this embodiment, the levels of output signals from the input level adjusting circuit 80 and output level adjusting circuit 81 shown in the fourteenth embodiment are made to increase with the increase in temperature.

As described in the fourteenth embodiment, the gain of the high power amplifier connected after the linearizer is varied due to variation of the characteristics of the semi-conductor elements 3, as well as due to temperature-dependent variation of their characteristics. The gain decreases with the increase in temperature. The power inputted to the high power amplifier needs to increase with the increase in temperature in order to achieve good distortion compensation.

The output level adjusting circuit 81 comprising the variable attenuator or variable gain amplifier is connected as shown in this linearizer. The power inputted to the high power amplifier can be increased at a higher temperature by decreasing the attenuation in the variable attenuator, or by increasing the gain in the variable gain amplifier. This realizes good distortion compensation at various temperatures, even when the gain of the high power amplifier varies due to the change in temperature.

[Sixteenth embodiment]

Figure 24:
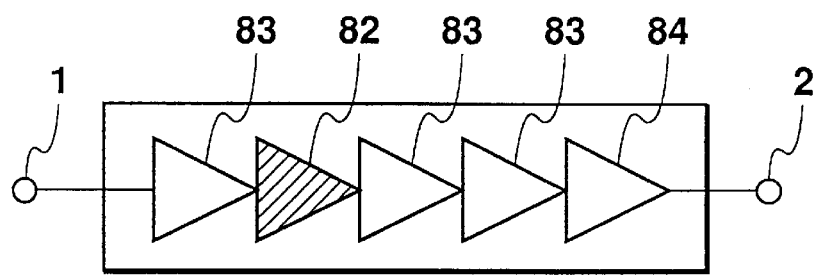
FIG. 24 shows a block diagram of a high frequency amplifier according to the sixteenth embodiment of the present invention.

FIG. 24 shows a block diagram of a high power amplifier according to this embodiment. The high power amplifier has an amplifier module 82 to which a D.C. bias below a knee voltage is applied, an amplifier module 83 to which a normal D.C. bias is applied, and serially connected high power amplifier modules 84. The sources 6 of the semi-conductor elements 3 in the amplifier modules 82, 83 and 84 are grounded. An output signal of the amplifier module 82 to which a D.C. bias below a knee voltage is applied has amplitude and phase characteristics shown by the curves D and H in FIG. 15, respectively. An output signal of the high power amplifier module 84 generating distorted waves has amplitude and phase characteristics shown by the curves I and K in FIG. 15, respectively. The output signal of the high power amplifier module 84 can offset the output signal of the amplifier module 82 in both amplitude and phase characteristics. Consequently, the characteristics of the compensated output signal from the high power amplifier have good linearity shown by the curves J and L in FIG. 15.

A D.C. bias below a knee voltage is applied to one of the amplifier modules included in the high power amplifier so that the amplifier module can be used as a linearizer. This realizes a high power amplifier having low distortion without any particular linearizer, enabling the size and cost of the high power amplifier to be reduced.

While there have been described what are at present considered to be preferred embodiments of the present invention, it will be understood that various modifications may be made thereto, and it is intended that the appended claims cover all such modifications as fall within the true spirit and scope of the present invention.

What is claimed is:

1. A distortion compensation circuit comprising:
   a semi-conductor element having a gate, source and drain; and
   an input circuit and an output circuit which are connected to the semi-conductor element, wherein the input circuit is connected to the gate, the output circuit is connected to one of the drain and source, the other of the drain and source not connected to the output circuit is grounded, and an external direct current (D.C.) bias is not applied to any of the gate, source or drain of the semi-conductor element.

2. A distortion compensation circuit in accordance with claim 1, wherein at least one of the gate, source and drain of the semi-conductor element is grounded via a return circuit including a resistor.

3. A distortion compensation circuit in accordance with claim 1, wherein at least one of the gate, source and drain of the semi-conductor element is grounded via a return circuit including a capacitor.

4. A distortion compensation circuit in accordance with claim 1, wherein a variable attenuator is connected before or after the input circuit.

5. A distortion compensation circuit in accordance with claim 1, wherein an amplifier is connected before or after the input circuit.

6. A distortion compensation circuit in accordance with claim 1, wherein a plurality of the distortion compensation circuits are arranged in parallel, and an output terminal of one of the distortion compensation circuits and an output terminal of another of the distortion compensation circuits are connected via a coupler and an input terminal of one of the distortion compensation circuits and an input terminal of another of the distortion compensation circuits are connected via a coupler.

7. A distortion compensation circuit comprising:
   a semi-conductor element having a gate, source drain; and
   an input circuit and an output circuit which are connected to the semi-conductor element, wherein the input circuit is connected to the gate, the output circuit is connected to one of the drain and source, the other of the drain and source not connected to the output circuit is grounded, and a predetermined constant D.C. bias voltage is applied to only one of the gates source or drain of the semi-conductor element;
   wherein a plurality of the distortion compensation circuits are arranged in parallel, and an output terminal of one of the distortion compensation circuits and an output terminal of another of the distortion compensation circuits are connected via a coupler and an input terminal of one of the distortion compensation circuits and an input terminal of another of the distortion compensation circuits are connected via a coupler.

8. A distortion compensation circuit in accordance with claim 7, wherein the external D.C. bias voltage is applied to the semi-conductor element via a diode.

9. A distortion compensation circuit in accordance with claim 7, wherein a variable attenuator is connected before or after the input circuit.

10. A distortion compensation circuit in accordance with claim 7, wherein an amplifier is connected before or after the input circuit.

11. A distortion compensation circuit comprising:
    a semi-conductor element having a gate, source and drain; and
    an input circuit and an output circuit which are connected to the semi-conductor element, wherein the input circuit is connected to the gate, the output circuit is connected to one of the drain and source, the other of the drain and source not connected to the output circuit is grounded, and a predetermined constant D.C. bias voltage is applied to only one of the gate, source or drain of the semi-conductor element;
    wherein one of said input and said output circuits includes a high frequency amplifier having a plurality of amplifier modules, wherein a D.C. bias is not applied to at least one of the amplifier modules.

12. A distortion compensation circuit comprising:
    a semi-conductor element having a gate, source and drain; and
    an input circuit and an output circuit which are connected to the semi-conductor element, wherein the input circuit is connected to the gate of the semi-conductor element, the output circuit is connected to the drain of the semi-conductor element, the source of the semi-conductor element is grounded, a negative D.C. bias voltage is applied to the gate and a negative or positive D.C. bias voltage below a knee voltage is applied to the drain.

13. A distortion compensation circuit in accordance with claim 12, wherein the D.C. bias voltage applied to the gate or drain of the semi-conductor element is appropriately changed according to temperature.

14. A distortion compensation circuit in accordance with claim 12, wherein an input level adjusting circuit is connected before the input circuit.

15. A distortion compensation circuit in accordance with claim 14, wherein the level of an output signal of an output level adjusting circuit is made to increase with the increase in temperature.

16. A distortion compensation circuit in accordance with claim 12, wherein an input level adjusting circuit is connected before the input circuit, and an output level adjusting circuit is connected after the output circuit.

17. A distortion compensation circuit in accordance with claim 16, wherein the level of the output signal of the input level adjusting circuit, and the level of an output signal of the output level adjusting circuit, are made to increase with the increase in temperature.

18. A distortion compensation circuit as claimed in claim 12, wherein one of said input and said output circuits include:
 a high frequency amplifier having a plurality of amplifier modules, wherein a D.C. bias voltage below a knee voltage is applied to at least one of the amplifier modules.

* * * * *